United States Patent [19]

Carlson et al.

[11] 4,115,185

[45] Sep. 19, 1978

[54] METHOD OF THERMALLY DIMENSIONALLY STABILIZING A PRINTED CIRCUIT BOARD

[75] Inventors: Carl S. Carlson, Costa Mesa; Lawrence M. Kinsella, Irvine; Daniel L. Pixley, Mira Loma, all of Calif.

[73] Assignee: Diceon Electronics, Inc., Santa Ana, Calif.

[21] Appl. No.: 822,141

[22] Filed: Aug. 5, 1977

[51] Int. Cl.² ............................................. C23F 1/02
[52] U.S. Cl. .................................. 156/634; 156/656; 156/659; 156/661; 156/902; 427/97; 428/417; 428/418; 428/901
[58] Field of Search ............................... 156/630–634, 156/644, 645, 656, 901, 902, 659, 661, 645; 428/417, 418, 901, 137; 427/96–99; 174/68.5; 96/36.2; 29/625

[56] References Cited

U.S. PATENT DOCUMENTS 3,672,986  6/1972  Schneble et al. .............. 156/901 X
3,808,028  4/1974  Lando ........................... 156/901 X Primary Examiner—William A. Powell Attorney, Agent, or Firm—Daniel J. Meaney, Jr.

[57] ABSTRACT

A method of thermally dimensionally stabilizing a printed circuit board prior to drilling and chemically processing wherein the printed circuit board has an epoxy fiberglass base and a layer of conductive material bonded to at least one side of the insulating base by transporting the printed circuit board thru a thermal shocking intense heat having a temperature of about 425° F to about 450° F (about 218° C to about 232° C) and a boiling point temperature in excess of 450° F (232°) for a period of time at least equal to that required to stress relieve the epoxy fiberglass base and promote dimensional movement between the epoxy, fiberglass, and metal conducting layer which the printed circuit board would otherwise experience during the subsequent process steps including the shear displacement between the insulating base and conductive metal layer which would otherwise occur after the selective removal of the conductive metal layer to form conductive metal parts by less than the time required for the conductive metal layer to delaminate from the insulating base is shown.

13 Claims, 6 Drawing Figures

METHOD OF THERMALLY DIMENSIONALLY STABILIZING A PRINTED CIRCUIT BOARD

BACKGROUND OF THE INVENTION

1. Field of the Invention

This invention relates to a method of thermally dimensionally stabilizing a printed circuit board prior to chemically processing of the board and more particularly to a method for thermally stabilizing a printed circuit board having an epoxy fiberglass base and a layer of conductive material bonded to at least one side of the insulating base. This method has wide application for use in fabrication and production of printed circuit boards using a laminated epoxy fiberglass insulated base and conductive metal layer. The variations in dimensions between apertures formed in and through the printed circuit board during the manufacture thereof and the variations in dimension between elements of the various conductive metal paths formed in the conductive metal layer of the printed circuit board are minimized thereby controlling the tolerances between elements forming the printed circuit board.

2. Disclosure of the Prior Art

It is known in the prior art to manufacture printed circuit boards from a laminate formed of epoxy fiberglass insulating base and a conductive metal layer bonded to the insulating base. During typical processing of a printed circuit board fabricated from such a laminate, the dimensions between elements of the printed circuit board will vary about 0.005 inches per foot (0.417 millimeters per meter) to about 0.010 inches per foot (0.834 millimeters per meter).

Typically, the process of manufacturing printed circuit boards includes a plurality of steps which include, without limitation, subjecting the printed circuit board to etching solutions, high temperature treatment solutions, hot oil baths, molten solder and the like. During a typical process, dimensional changes in the printed circuit board are incurred and, resultantly, the dimensions between apertures and elements forming the metal conductive paths have a wide range of variance.

In order to reduce the amount of variances in dimensions, it is known in the art to place the laminate of epoxy fiberglass insulating base and conductive metal layer into an oven and bake the same for approximately 3 or 4 hours at about 325° F (about 163° C) to fully thermally cure the epoxy in the insulating base. By use of this technique, the shrinkages and dimensional change experienced by the printed circuit board during the processing is reduced to less than 0.005 inches per foot to about 0.004 inches per foot (about 0.167 millimeters per meter to about 0.334 millimeters per meter) of lineal board dimension.

For a number of reasons, manufacturers of electronic equipment, apparatus and systems require that printed circuit boards be provided wherein the tolerances thereof are limited to a maximum of 0.0015 inches per foot (0.125 millimeters per meter) or less.

One reason for this requirement of controlled specific tolerances is that automatic insertion equipment is used to insert integrated circuit devices, solid state devices, or other discrete components into apertures located in and through certain conductive metal elements forming the conductive metal paths of the printed circuit board and through the insulating base.

SUMMARY OF THE INVENTION

This invention overcomes several disadvantages of the prior art methods. In using the teachings of this invention, a number of factors must be considered such as the type of fiberglass used in fabrication of the insulating base, the adhesive which is used to bond or laminate a conductive metal layer to at least one or both surfaces of the insulating base and the thickness of the conductive metal layer. In substance, the thermally dimensionally stabilizing method of the present invention includes the step of, prior to drilling and etching, transporting the epoxy fiberglass insulating base and conductive metal layer laminate thru a thermal shocking intense heat source having a temperature of about 425° F to about 450° F (about 218° C to about 232° C) for about 20 seconds or less, depending on the thermally curing of the epoxy, resulting in predictable control of the dimensional tolerances per lineal dimension of a printed circuit board during fabrication thereof.

By utilizing the teachings of the present invention, printed circuit boards can be stabilized, prior to drilling and chemically processing, resulting in a substantial reduction in change of board dimensions during the remaining steps of the process such that the change in board dimensions are less than and do not exceed the maximum of 0.0015 inches per foot (0.125 millimeters per meter).

Therefore, one advantage of the present invention is that a change in printed circuit board dimension can be obtained prior to the steps of drilling and chemically processing a printed circuit board such that the resultant changes in printed circuit dimensions during the process steps are reduced, controlled and retained within a maximum limit of 0.0015 inches per foot (0.125 millimeters per meter).

Another advantage of the present invention is that the process of dimensionally stabilizing a printed circuit board can be accomplished with a high degree of predictability, thereby increasing the yield of the printed circuit board manufacturing process and a lower rejection rate by a customer having stringent acceptance standards.

BRIEF DESCRIPTION OF THE DRAWING

The foregoing and other advantages and features of the invention will be apparent from the following description of the preferred embodiment of the invention when considered with the illustration in the accompanying drawing which includes the following figures.

DESCRIPTION OF THE PREFERRED EMBODIMENT

Figure 1:
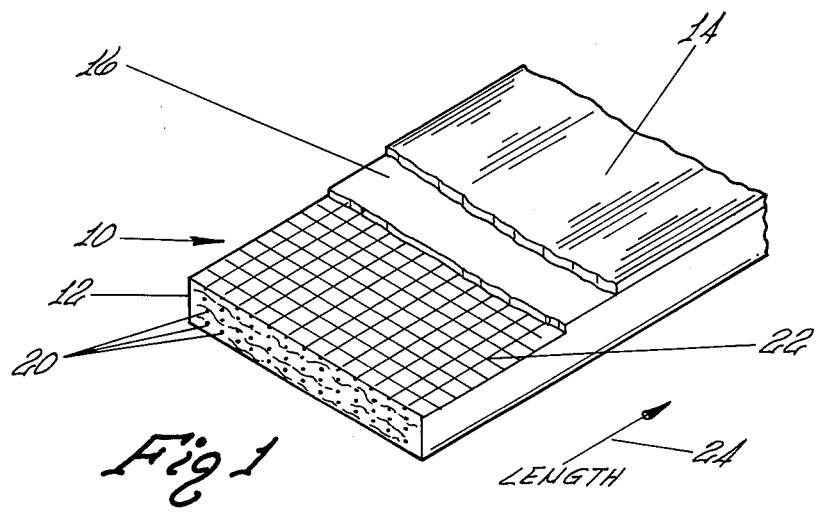
FIG. 1 is an isometric view partially in cross-section showing the construction of a printed circuit board laminate having an epoxy fiberglass insulating base and a conductive metal layer bonded thereto.

FIGS. 1 through 4, inclusive, disclose a method of thermally dimensionally stabilizing a printed circuit board and a thermally dimensionally stabilized printed circuit board having conductive metal paths formed thereon. FIG. 1 discloses a printed circuit board generally shown as 10 having an epoxy fiberglass insulating base 12 and a metal conductive layer 14 bonded to at least one side of the insulating base 12. The top surface of base 12 is shown as 16. The insulating base 12 has a plurality of fiberglass filaments on threads 20 which extend lengthwise forming the warp and crosswise forming the woof which define a fiberglass cloth, generally shown as 22. The fiberglass threads 20 extend in a direction lengthwise forming the warp, as shown by arrow 24, relative to the threads forming the woof which extend normal to the direction of length shown by arrow 24. Physical stabilization of the insulation base is improved by laying the warp of each succeeding layer of fiberglass cloth at right angles to each other. In most laminates, the expansion and contraction of the insulating base is primarily in the direction shown by arrow 24.

Figure 2:
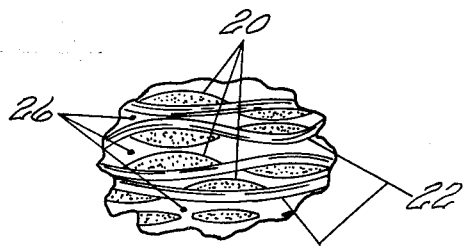
FIG. 2 is an end view of the insulating base material of FIG. 1 showing the strands of fiberglass surrounded by epoxy.

FIG. 2 shows the layering of a typical insulating base into a plurality of levels wherein fiberglass filaments 20 extend lengthwise in the direction of arrow 24 of FIG. 1 and fiberglass filaments 22 extend normal to arrow 24. Typically, shrinkage of the insulating base occurs primarily along the axis of extension of the fiberglass threads 20 and 22. The epoxy 24 fills in fiberglass cloth to form a rigid stable insulating base material for the printed circuit board.

Figure 3:
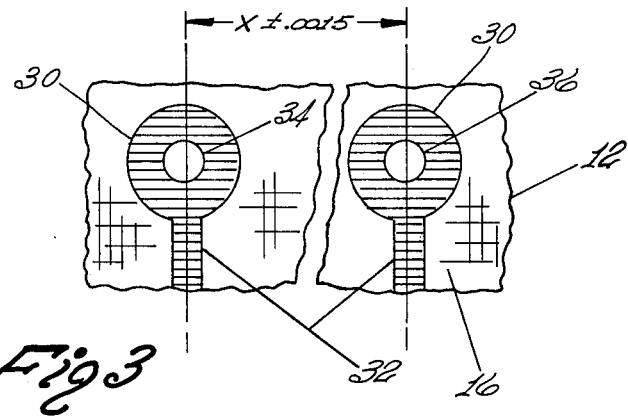
FIG. 3 is a schematic representation of maximum dimensional changes permitted per lineal dimension between apertures located on terminals forming the conductive metal patterns.

FIG. 3 illustrates a thermally dimensionally stabilized printed circuit board showing the conductive metal paths formed thereon after photo-resisting, etching and drilling. The insulating base 12 has its top surface 16 exposed due to the selective removal of portions of the metal conducting layer 14 to form terminal paths 30 and conductive leads 32 extending therefrom. The terminal pads 30 are shown to have apertures 34 and 36 formed therethrough and through the entire length of the insulation base 12. Typically, elements such as integrated circuits, capacitors or discrete components are mounted either mechanically or by machines onto the printed circuit board to form a completed electrical circuit.

The control of dimensions or tolerances in manufacture of printed circuit boards is very important. By using the teachings of this invention, the dimensional changes in a printed circuit board, the resulting variances in the tolerances and control of the variances between apertures in the printed circuit board and the distances between parts of the conductive metal paths can be precisely controlled. In the preferred embodiment, the distance between apertures 34 and 36, as an example, do not vary more than ±0.0015 inches per foot of printed circuit board.

Figure 4:
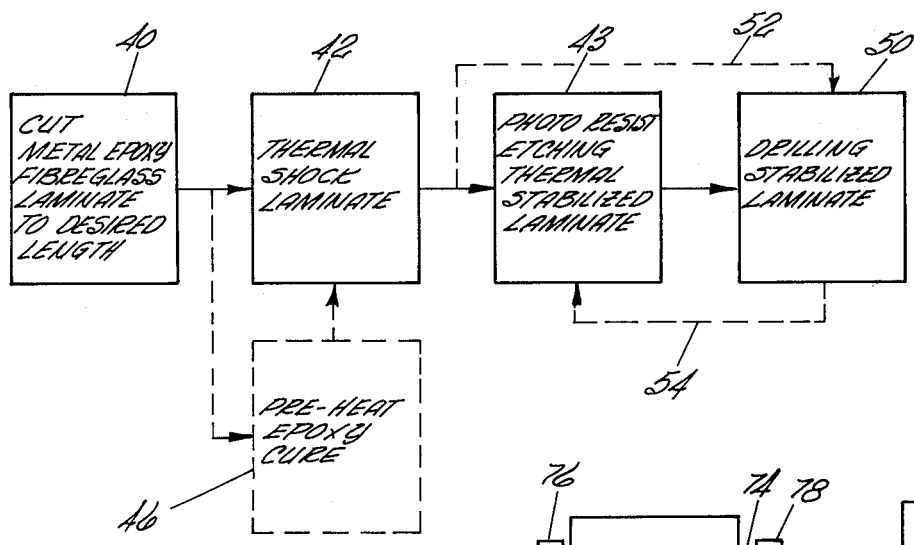
FIG. 4 is a blocked diagram of the steps of the process showing that the laminate can be directly thermally shocked or first pre-heated to cure the epoxy prior to further processing.

FIG. 4 illustrates the various steps which can be used for producing a thermally dimensionally stabilized printed circuit board using the teachings of this invention. In substance, the method of this invention is used prior to drilling and forming the conductive metal layer into conductive metal paths by selective removal of certain portions of the metal layer. The initial step is generally to cut the metal epoxy fiberglass laminate to the desired size required for the final printed circuit board and this step is illustrated by rectangle 40. Prior to drilling and forming the conductive metal layer into conductive metal paths by selective removal thereof, the printed circuit board is transported thru a thermal shocking intense heat source, illustrated by rectangle 42. The intense heat source has a temperature of about 425° F to about 450° F (about 218° C to about 232° C) for a period of time at least equal to the time required to stress relieve the epoxy fiberglass base and promote dimensional movement between the epoxy, fiberglass and metal conducting layer which would otherwise occur during processing of the printed circuit board and conductive metal laminate into a printed circuit board having conductive metal paths formed thereon. The changes in dimensions generally occur from two sources: namely; the expansion and contraction which the printed circuit board would otherwise experience by being stress relieved during the subsequent processing steps such as photo-resist coating, etching, drilling, soldering, heat treatment or the like. Secondly, during the various steps, a shear force is developed between the conductive metal layer and the insulating base. Selective portions of the conductive metal layer 14 as shown in FIG. 1, are removed to form the conductive metal paths such as 30 and 32 in FIG. 3. The shear force existing between the conductive metal layer 14 insulating base 12 and the bonding material between the opposing surfaces of the layer 14 and base 12. This, with the removal of selective portions of the conductive metal layer 14, one of the lateral sides used to develop the shear displacement is removed thereby permitting the surface 16 to stabilize with the remaining portion of the insulating base material 14. The amount of shear displacement between the insulating base 12 and the conductive metal layer 14, which would otherwise occur after selective removal of the conductive metal layer 14 to form conductive metal parts, can be accurately determined.

The printed circuit board 10 is transported thru the thermal shocking intense heat source, as shown by rectangle 42, less than the time required for the bonded conductive metal layer 14 to separate or delaminate from the insulating base 12. The thermal shocking fluid is selected to have a boiling point temperature in excess of 450° F (232° C).

A preheating step may be used to cure the epoxy prior to the thermal shocking step illustrated by rectangle 42. This preliminary step is shown by rectangle 46 and includes a step of, prior to thermal shocking, baking the laminate formed of the epoxy fiberglass base and conductive metal layer at a temperature of about 325° F (about 163° C) for a period of 4 hours. This has the effect of thermally curing the epoxy so that the thermally shocking thereof, the amount of dimensional changes which would otherwise occur during the thermal shocking steps, is reduced.

When the conductive metal layer and epoxy fiberglass insulating base laminate is transported thru the thermal shocking intense heat source, as shown by the thermal shocking step illustrated by rectangle 42, generally the time that the laminate is retained in the intense heat source is longer than the time required if the preheating step is first used as illustrated by the step of rectangle 46. For purposes of example, the intense heat source may be a thermal shocking fluid. If the metal epoxy fiberglass laminate is immersed directly into the thermal shocking fluid without the precuring step, the laminate need be immersed for a period of about 20 seconds.

Alternatively, if the metal fiberglass laminate is preheated prior to the thermal shocking step as illustrated by rectangle 46, the time required for immersion of the laminate in a thermal shocking fluid may be reduced a period of about 3 or 4 seconds. One possible reason for the differences in time is that by bypassing the pre-heating step, as illustrated by rectangle 46, it is necessary to hold the laminate in a thermal shocking fluid for a sufficient period of time to both cure the epoxy and to otherwise stabilize the printed circuit board. However, depending on the stress within the printed circuit board, amount of curing earlier experienced by the epoxy, it is possible for the thermal shocking time to be about 4 seconds without a preheat.

After the thermal shocking step illustrated by rectangle 42, the printed circuit board laminate is further processed. The printed circuit board is then drilled, as shown by arrow 52, to form apertures through the selected portions of the conductive metal patterns and through the insulating base itself. The step of drilling is illustrated by rectangle 50. Typically, the drilling is performed by tape controlled drilling apparatus which is capable of drilling a plurality of printed circuit boards concurrently either in a stacked or planar arrangement or both. Since the drilling is done by tape controlled drilling apparatus, each hole is precisely drilled in a pre-programmed location and the drilling thereof is controlled by pre-programmed tapes.

After the laminate is drilled, the drilled thermal shock laminate may then be subjected to an application of a photo-resist layer, which photo-resist layer is exposed to form an image of the conductive metal paths to be formed by selective removal of the conductive metal layer. Thereafter, the image is developed and the photo-resist layer, in areas other than where the conductive metal pattern is to be formed, is removed. The printed circuit board is then etched by means of a known etching process all as illustrated by rectangle 43. Depending on the process steps, the drilling illustrated by rectangle 50 could well occur after the photo-resist etching in other steps illustrated by rectangle 48. This is shown by the alternate dash arrows 52 and 54.

Figure 5:
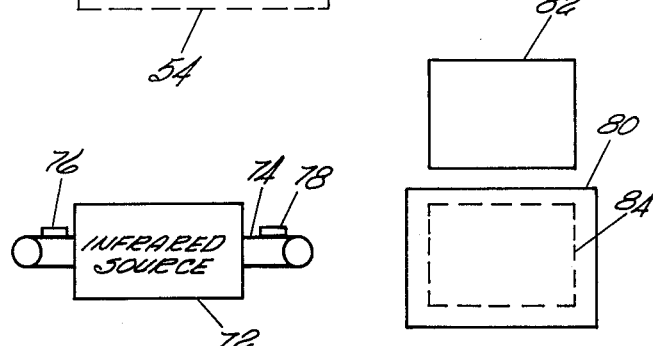
FIG. 5 is a pictorial representation of an infrared source as the thermal shocking intense heat source.

FIG. 5 shows that the thermal shocking intense heat source may be an infrared source 72 having an endless conveyor 74 which transports printed circuit board 76 to be dimensionally stabilized into the infrared source 72. A stabilized printed circuit board 78 is shown being transported out of the infrared source 72.

Figure 6:
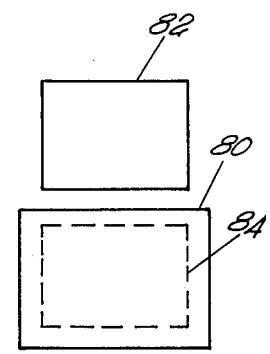
FIG. 6 is a pictorial representation of a tank having a thermal shocking fluid as the thermal shocking intense heat source.

FIG. 6 shows that the thermal shocking intense heat source may be a thermal shocking fluid such as a hot oil bath or hot solder in a tank 80. A printed circuit board to be stabilized 82 is immersed in the fluid as shown by dashed box 84.

Methods for thermally dimensionally stabilizing a printed circuit board of this invention are described in the following specific examples, given herein to enable a more comprehensive understanding of the invention.

EXAMPLE 1

A rigid laminate, Type EG 818T, manufactured and sold by Mica Corporation, Culver City, California, was utilized for fabrication of a printed circuit board. The rigid laminate had an overall thickness of about 0.058 inches (about 0.147 centimeters).

A rigid laminate, Type EG 818T, manufactured and sold by Mica Corporation, Culver City, California, was utilized The board had an insulating base formed of epoxy and fiberglass and two copper conductive layers, one on each side of the base. The epoxy-fiberglass base was formed by multi-layers of fiberglass, generally known as Style 7628, manufactured and sold by Burlington Glass Fabrics Company. Generally, Style 7628 glass has a thickness of approximately 0.007 inches (about 0.18 millimeters). A thin layer of copper foil having a weight of 1 ounce per square foot (about 305 grams per square meter) and a thickness of approximately 0.0014 inches (about 0.036 millimeters) was affixed to each opposed surface of the insulating base. The boards were then cut into rectangular pieces, having dimensions of 13 inches by 16 inches (about 33 centimeters by about 40 centimeters). In order to facilitate measurements during the thermal shocking process, pilot holes were drilled in each corner to afford a means for measuring the dimensional changes in all directions.

Thereafter, the cut rigid laminates were immersed in a shocking oil for a period of about 4 seconds. The shocking oil used was Wedco Flow Fuser No. 1003, which is a water soluble oil, sold by Weston Chemical & Manufacturing Company. Fuser Oil No. 1003 has a flashpoint, determined by using the Cleveland Open Cup measuring technique, at 595° F (about 312° C), and a firepoint, using the Cleveland Open Cup measuring technique, at 600° F (about 316° C).

After thermal shocking of the laminate, the following dimensional changes were measured:

a. In the 13 inch (about 33 centimeters) direction, the change was 0.0007 inches (about 0.018 millimeters) in 13 inches (about 33 centimeters) or 0.00064 inches per foot (about 0.053 millimeters per meter) change.

b. In the 16 inch (40 centimeters) direction, the change was 0.0045 inches (0.114 millimeters) for 16 inches (40 centimeters), or a −0.0034 inch per foot (about 0.283 millimeters per meter) change.

Thereafter, the thermally shocked rigid laminate was drilled with an Excellon Mark III machine with 0.100 inches (2.54 millimeters) spacing and hole diameters of 0.043 inches (1.09 millimeters). The board was remeasured after drilling, and the measured dimensions were the same as the dimensions of the board after the thermal shocking step.

The rigid laminate was then sanded and copper plated in a copper pyrophosphate bath, having sufficient copper in suspension for plating copper, as is well known to those skilled in the art. Approximately 0.0012 inches (about 0.03 millimeters) of copper is plated in the holes and about 0.0014 inches (about 0.036 millimeters) of copper is plated on the surface of each of the copper conductive layers. After the step of copper coating, the total copper thickness on the conductive surface is approximately 0.0025 inches (about 0.064 millimeters).

Thereafter, a dry film-resist, such as DuPont Riston, Type 116S, manufactured and sold by E. I. DuPont DeNemours and Co., Inc., Wilmington, Delaware, is applied to each copper layer. Riston Type 116S is a dry film photo-resist laminate. The photo-resist laminate is applied onto the surface of each conductive copper layer by means of a hot roll process. An image was then applied photographically to the photo-resist layer, forming conductive metal patterns. The imaged photo-resist layer was developed using techniques known in the art. During development, selective portions of the Riston laminate, or photo-resist layer, are removed in the areas where the copper is to be chemically removed. The unremoved areas define the conductive metal patterns to be formed in the conductive metal layer.

After the photo-resist layer has been developed, exposing the areas of copper of the conductive metal layer to be chemically removed, the rigid laminate with the imaged photo-resist was transported through an etching solution. The etching solution was a ferric chloride solution, 42 Baume. The ferric chloride solution used in this example is sold by Southern California Chemical Company of Los Angeles. During the etching, copper line segments forming the conductive paths terminating in pad areas had an average overall width of about 0.0010 inches (about 0.0254 millimeters), separated by spacings of approximately 0.0012 inches (about 0.03 millimeters). Printed contacts adapted to be used for electrically connecting the printed circuit board to a master board were formed along one edge.

Thereafter, an epoxy base solder mask was applied to all areas of the board except for the holes, pads, and printed contacts.

The coated epoxy based solder mask laminate subassembly was baked in an oven for one hour at 300° F. Thereafter, the assembly was dipped into a flux and then into a solder bath at a temperature of 425° F (about 218° C) for 4 seconds.

Excess solder was removed by Model 500M Hydro-Squeegee solder leveling machine, manufactured by Norfax Corporation, San Diego, California. The Hydro-Squeegee solder leveling machine forcibly sprays the assembly with a hot fuser oil for about 10 seconds, or until the excess solder has been removed. The fuser oil media used in this step was Wedco Slow Fuser No. 1003. The temperature of the fuser oil was 425° F (about 218° C).

After the above manufacturing of the printed circuit board was completed, the final dimensions were measured to be as follows:

a. In the 13 inch (30 centimeters) direction, the change was −0.0009 inches (about 0.023 millimeters) in 13 inches (33 centimeters) of length, or −0.0008 inches per foot (0.067 millimeters per meter).

b. In the 16 inch (40 centimeters) direction, the change was +0.0015 inches (0.038 millimeters) in 16 inches (40 centimeters) of length, or a change of +0.0011 inches per foot (0.0917 millimeters per meter).

EXAMPLE 2

A second rigid laminate, formed of EG 818T material as described in Example 1, was cut to the same size as Example 1, prior to the thermal shocking treatment. Instead of thermal shocking the board, the laminate was placed in a baking oven having a forced air circulating system to assure uniform temperature control throughout the oven. The oven temperature was 325° F (about 163° C) and the period of baking was 4 hours. After the baking, the EG 818T material had the following dimensional changes:

a. In a 13 inch (33 centimeters) direction, the change was −0.0033 inches (0.084 millimeters) for the 13 inch (33 centimeters) dimension, or 0.0030 inches per foot (0.25 millimeters per meter).

b. In a 16 inch (40 centimeters) direction, the change was −0.0005 inches (0.0127 millimeters) for the 16 inch (40 centimeters) dimension, or 0.0003 inches per foot (0.025 millimeters per meter).

After completion of thermal shocking of the board, rigid laminate was processed by the steps described in Example 1 above, and the following changes were measured:

a. In the 13 inch (33 centimeters) direction, the change was −0.0029 inches (0.074 millimeters) for the 13 inch (33 centimeters) dimension, or a change of −0.0027 inches per foot (0.225 millimeters per meter).

b. In the 16 inch (40 centimeters) direction, the change was −0.0009 inches (0.023 millimeters) for the 16 inch (40 centimeters) dimension, or a change of −0.0007 inches per foot (0.058 millimeters per meter).

During the process described in Example 1 above, the board is sprayed in the fuser oil for a period of about 10 seconds to remove the excess solder at a temperature of 425° F (about 218° C).

In the above examples, the rigid laminate was Type EG 818T, as described above. Also, the above process has shown excellent results when used with other rigid laminates, such as Type AL-3137FR, manufactured and sold by Atlantic Laminate of Hayward, California, and Type 65M-28, manufactured and sold by Westinghouse Electric Corporation, having representatives in El Monte, California.

Any of the above three rigid laminates can be thermally stabilized by use of an infrared source, such as, for example, infrared conveyor Model No. 4682, manufactured and sold by Research Incorporated, Minneapolis, Minnesota. The wattage of the infrared conveyor is about 25,000 watts total, which produced about 3,300 watts per square foot of exposed surface in a chamber that measured 29 inches by 19 inches (73.7 centimeters by 48.3 millimeters). The time of heat exposure is approximately 35 seconds.

The above examples are not intended to limit the use of the thermal shocking stabilizing method. Of importance, is to stabilize the amount of dimensional change a rigid laminate formed of an epoxy fiberglass base and a conductive metal layer would experience during normal processing in the fabrication of a printed circuit board. In substance, by removing the internal stresses within the epoxy fiberglass base and the stresses occurring at the surface boundary between the conductive metal layer and the insulating base, the expansion and contraction due directly to internal stress and boundary layer conditions can be substantially reduced to the level where the remaining dimensional changes incurred during the steps of producing are minimized and, most importantly, predictable within a specified tolerance range.

What is claimed is:

1. A method of thermally dimensionally stabilizing a printed circuit board wherein the printed circuit board has an epoxy fiberglass insulating base and a metal conducting layer bonded to at least one side of the insulating base comprising prior to drilling and forming the conductive metal layer into conductive metal path by selective removal thereof, transporting the printed circuit board thru a thermal shocking intense heat source having a temperature of about 425° F to about 450° F for a period of time at least equal to that required to stress relieve the epoxy fiberglass base and promote dimensional movement between the epoxy, fiberglass and metal conducting layer which the printed circuit board would otherwise experience during the subsequent process steps including the shear displacement between the insulating base and conductive metal layer which would otherwise occur after the selective removal of the conductive metal layer to form conductive metal paths and less than the time required for the bonded conductive metal layer to separate from the insulating base, said thermal shocking fluid having a boiling point temperature in excess of 450° F.

2. The method of claim 1 wherein the thermal shocking heat source is an infrared source.

3. The method of claim 1 wherein the thermal shocking heat source is a thermal shocking fluid.

4. The method of claim 3 wherein the transporting step includes immersing the printed circuit board into the thermal shocking fluid.

5. The method of claim 4 further comprising the step of, prior to immersing, baking the epoxy and fiberglass base of the printed circuit at a temperature of about 325° F for a period of 4 hours.

6. The method of claim 4 wherein the printed circuit board is immersed in the thermal shocking fluid for a period of about 20 seconds.

7. The method of claim 5 wherein the printed circuit board is immersed in the thermal shocking fluid for a period of about 3 to 4 seconds.

8. The method of claim 3 wherein the thermal shocking fluid is a hot oil bath.

9. The method of claim 3 wherein the thermal shocking fluid is hot solder.

10. The method of claim 1 further comprising the step of drilling the thermally stabilized printed circuit board to produce apertures therethrough and through certain locations of the conductive metal paths.

11. The method of claim 10 further comprising the step of
chemically processing the conductive metal layer of the thermally dimensionally stabilized printed circuit board into conductive metal patterns having the drilled apertures extending through certain locations therein.

12. The method of claim 11 wherein the chemical processing includes the step of
forming an image on the conductive metal layer representing the conductive pattern with a material which resists chemically etching of said conductive metal layer in the areas representing the conductive pattern and which permits chemically etching of the remaining areas of the conductive metal layer.

13. The method of claim 12 wherein the chemical processing includes the steps of
chemically etching the printed circuit board forming the conductive pattern from said conductive metal layer; and
stripping the etching resist material from the remaining conductive material pattern.

* * * * *